United States Patent
Park et al.

(10) Patent No.: US 7,285,820 B2
(45) Date of Patent: Oct. 23, 2007

(54) FLASH MEMORY DEVICE USING SEMICONDUCTOR FIN AND METHOD THEREOF

(75) Inventors: Ji-Hoon Park, Seoul (KR);
Seung-Beom Yoon, Gyeonggi do (KR);
Jeong-Uk Han, Gyeonggi-do (KR);
Seong-Gyun Kim, Gyeonggi-do (KR);
Sung-Taeg Kang, Seoul (KR);
Bo-Young Seo, Gyeonggi-do (KR);
Sang-Woo Kang, Seoul (KR);
Sung-Woo Park, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 213 days.

(21) Appl. No.: 11/216,677

(22) Filed: Aug. 31, 2005

(65) Prior Publication Data

US 2006/0044915 A1 Mar. 2, 2006

(30) Foreign Application Priority Data

Sep. 1, 2004 (KR) ..................... 10-2004-0069666

(51) Int. Cl.
*H01L 29/788* (2006.01)
(52) U.S. Cl. ..................... 257/316; 257/321; 257/324; 257/627
(58) Field of Classification Search ................ 257/316, 257/321, 627, 324, 401
See application file for complete search history.

(56) References Cited

U.S. PATENT DOCUMENTS 6,342,410 B1   1/2002   Yu
6,657,259 B2   12/2003  Fried et al.
6,768,158 B2 * 7/2004  Lee et al. .................... 257/315
2004/0145000 A1 7/2004 An et al.
2005/0093074 A1 5/2005 Anderson et al.
2005/0093082 A1 5/2005 Son et al.
2005/0104130 A1 5/2005 Nowak et al.
2005/0121676 A1 6/2005 Fried et al.

FOREIGN PATENT DOCUMENTS

KR    1020030065864 A    8/2003

OTHER PUBLICATIONS

Ananthan et al., "FinFET SRAM—Device and Circuit Design Considerations," IEEE Computer Society, 2004 IEEE, 6 pgs.

* cited by examiner

*Primary Examiner*—Mark V. Prenty
(74) *Attorney, Agent, or Firm*—Myers Bigel Sibley & Sajovec PA

(57) ABSTRACT

A flash memory device according to the present invention includes a semiconductor fin including a top surface and a side surface originated from different crystal planes. The flash memory device comprises: insulating layers having different thicknesses formed on a side surface and a top surface of the semiconductor fin, a storage electrode, a gate insulating layer and a control gate electrode sequentially formed on the insulating layers. A thin insulating layer enables charges to be injected or emitted through it, and a thick insulating layer increases a coupling ratio. Accordingly, it is possible to increase an efficiency of a programming or an erase operation of a flash memory device.

24 Claims, 13 Drawing Sheets

FLASH MEMORY DEVICE USING SEMICONDUCTOR FIN AND METHOD THEREOF

CROSS-REFERENCE TO RELATED APPLICATIONS

This U.S. non-provisional patent application claims priority under 35 U.S.C. § 119 of Korean Patent Application 2004-69666 filed on Sep. 1, 2004, the entire contents of which are hereby incorporated by reference.

BACKGROUND OF THE INVENTION

The present invention relates to a semiconductor device and a method thereof, more particularly, to a semiconductor device using a semiconductor fin and a method thereof.

For the past 30 years, silicon based integrated circuit devices, especially, metal oxide semiconductor MOS devices such as electric field effect transistors FET or MOSFET have been manufactured to have a high speed, a high integration or improved functions, decreasing a cost per a work process, so-called a throughput. However, as more highly integrated devices continue to be requested in view of high performance, high speed, low power consumption and costs, there occur various problems including deteriorating characteristics of a transistor. For example, as a channel length of an electric field effect transistor becomes shorter, there occur short channel effects such as a punchthrough, a drain induced barrier lowering DIBL and a subthreshold swing, an increase of a parasitic capacitance or a contact capacitance between a contact area and a substrate, an increase of a leakage currents, and so on.

Thus, a process for manufacturing a fin electric field effect transistor in which a channel is formed in a semiconductor fin, a gate insulating layer is formed on the semiconductor fin, and a gate electrode is formed surrounding the semiconductor fin has been suggested. A fin electric field effect transistor having a channel formed on the semiconductor fin can decrease a channel length less than 50 nm, for example, 10 nm. Therefore, an improvement of an additional integration density and a speed is expected.

A flash memory device as an electrically programmable non-volatile memory device can carry out a programming operation in a unit of page or multibits, and an erase operation in a unit of block or sector, and has very excellent characteristics in view of speed. The above flash memory device can be employed in various devices such as a digital mobile phone, a digital camera, a LANSwitch, a PC card in a notebook computer, a digital setTop box, a built-in controller and so on.

FIG. 1 schematically illustrates a conventional flash memory device. Referring to FIG. 1, the flash memory device includes a gate structure stacked on a substrate 11. The stacked structure includes a tunneling oxide layer 15, a floating gate electrode 17, a gate insulating layer 19 and a control gate electrode 21. A source region 13S and a drain region 13D are located on a substrate at both sides of the stacked gate structure. If an appropriate bias voltage is applied to the control gate electrode 21, the source region 13S, the drain region 13D and the substrate 11, the electrically isolated floating gate 17 is charged or discharged into charges, and a threshold voltage is changed into two levels. Therefore, the flash memory device can perform as a memory device capable of storing binary information.

In the meantime, in order to maintain a high capacity, a high speed, a low power consumption and low costs, a semiconductor device is continuously requested to be highly integrated. The floating gate electrode 15 can be charged or discharged with a Fowler-Nordheim tunneling (F-N tunneling) or a channel hot carrier injection CHCI. In a case of using the F-N tunneling method, a high voltage is applied to the control gate electrode 21 and the substrate 11, and the charges penetrate the tunneling insulating layer 13 to be accumulated on the floating gate electrode 15. Accordingly, the tunneling insulating layer 13 should be thin enough for a tunneling of charges. However, if the tunneling insulating layer 13 is too thin, the charges can penetrate the thin tunneling insulating layer even though a very low bias voltage or no bias voltage is applied in comparison with a programming or an erase operation. A limit in a thickness of the tunneling insulting layer 13 is operated as a factor disturbing the high integration of a flash memory device.

Thus, attempts to apply for a flash memory device using a semiconductor fin in a Complementary Metal Oxide Semiconductor CMOS device have been made, recently. For instance, a flash memory device using a semiconductor fin published No. 2003/0042531 A1 in the name of Jong-Ho LEE is disclosed under the title of "FLASH MEMORY ELEMENT AND MANUFACTURING METHOD THEREOF". According to the disclosure, a semiconductor fin is formed using an oxide layer mask, and both side surfaces of the semiconductor fin is operated as an active region namely, a channel. The invention disclosed by Jong-Ho LEE is interested in scaling down a flash memory device.

However, an efficiency of a programming and an erase operation should be taken into consideration in conjunction with scaling down a flash memory device. This is closely related to a capacitive coupling of a floating gate electrode with respect to a control gate electrode and a substrate. FIG. 2 schematically illustrates a capacitive coupling of a floating gate electrode with respect to various terminals in a flash memory device. Capacitances between a floating gate and each of a control gate, a substrate, a source region and a drain region, respectively are represented as $C_{ONO}$, $C_{TOX}$, $C_{SRC}$ and $C_{DRN}$. Even not shown in the drawings, a capacitor component between the substrate and the floating gate electrode includes not only a component $C_{TOX}$ due to a tunneling oxide layer but also a component $C_{FOX}$ due to a field oxide layer. Accordingly, a capacitance in total $C_{TOT}$ is represented in the formula 1 as follows, $$C_{TOT} = C_{ONO} + C_{TOX} + C_{SRC} + C_{DRN} + C_{FOX} \qquad \text{Formula 1}$$

As an amount of charges $Q_{FG}$ stored in the floating gate is not changed by a minute change of a bias with respect to various terminals, an amount of charges in total is represented in the formula 2 as follows, $$Q_{FG} = 0 = C_{ONO}(V_{FG} - V_G) + C_{SRC}(V_{FG} - V_S) + C_{DRN}(V_{FG} - V_D) + C_{TOX}(V_G - V_{SUB}) \qquad \text{Formula 2}$$

Here, it is assumed that a substrate bias is fixed, and the components $C_{TOX}$ and $C_{FOX}$ are ignored.

The floating gate electrode voltage $V_{FG}$ is indirectly determined by a coupling ratio due to a bias voltage applied to a control gate electrode, a drain and a source, and is represented in the formula 3 as follows, $$V_{FG} = V_G \times GCR + V_S \times SCR + V_D \times DCR \qquad \text{Formula 3}$$

Here, $GCR = C_{ONO}/C_{TOT}$, $DCR = C_{DRN}/C_{TOT}$, and $SCR = C_{SRC}/C_{TOT}$.

Accordingly, it is known that a coupling ratio in each term in the right side of the formula 3 needs to be increased in order to increase a floating gate electrode voltage $V_{FG}$ having a direct influence on an efficiency of a programming or an erase operation. In particular, one method may be to increase a coupling ratio GCR with respect to the floating gate electrode due to a bias voltage $V_G$ applied to the control gate electrode. For this, $C_{TOT}$ should be lowered, and a capacitance contribution component $C_{TOX}$ due to a tunneling insulating layer needs to be increased.

SUMMARY OF THE INVENTION

Exemplary embodiments of the present invention provide a flash memory device having a high scalability and a programming or erasing efficiency and a method thereof.

Exemplary embodiments of the present invention provide a flash memory device using a semiconductor fin. The semiconductor fin of the present invention includes a top surface and a side surface. The top surface and the side surface of the semiconductor fin are not equal in crystallographical point of view. An insulating layer is positioned on the top surface and the side surface of the semiconductor fin, a storage electrode is positioned on the insulating layer, and a control gate electrode is positioned on the storage electrode.

The insulating layer is formed to have different thicknesses at the top surface and the side surface. In an embodiment, the insulating layer may be a thermal oxide layer. As the top surface and the side surface are different in crystallographical point of view, the top surface and the side surface of the semiconductor fin have different silicon atom densities. Since the thermal oxide layer is formed to have different thicknesses at the top surface and the side surface, respectively, electric charges are injected or emitted (charged or discharged) not through a relatively thick thermal oxide layer but through a relatively thin thermal oxide layer.

Therefore, electric charges are injected or emitted through the relatively thin insulating layer. In the meantime, due to the relatively thick insulating layer which can be formed on the top surface or the side surface of the semiconductor fin, a coupling ratio by a control gate is increased, thereby improving en efficiency of a programming or an erase operation.

In the meantime, in a case of a read operation for reading out information stored in the storage electrode, a speed of read operation is improved as channels are formed at both the side surface and the top surface of a semiconductor fin.

For instance, the thick insulating layer is about 1.3 through 1.4 times as thick as the thin insulating layer. In a case that an area of the side surface of the semiconductor fin is the same as that of the top surface, a coupling ratio of when the insulating layers with different thicknesses are formed on a side surface and a top surface of the semiconductor fin is increased by 7 through 10% in comparison with a coupling ratio of when the insulating layers with the same thickness are formed on the side surface and the top surface of the semiconductor fin.

The semiconductor fin is formed to have a silicon single crystal, a silicon germanium single crystal, a tense silicon single crystal and so on.

For example, the top surface of the semiconductor fin can be originated from a crystal plane (abc), and the side surface of the semiconductor fin can be originated from a crystal plane (hkl). In this embodiment, a, b and c are integers except 0 at the same time, and h, k and l are integers except 0 at the same time. A set of a, b and c and a set of h, k and l have, at maximum, only two integers in common. In other words, the top surface and the side surface of the semiconductor fin are not equivalent in crystallographical point of view. In one embodiment, if the top surface is {100} plane, the side surface is {110} plane, or if the top surface is {110} plane, the side surface is {100} plane. In one embodiment, if the top surface is {111} plane, the side surface is {110} plane, or if the top surface is {111} plane, the side surface is {100} plane.

In one embodiment, if the top surface is {100} and the side surface is {110} plane, a thermal oxide layer is formed to have a relatively thicker thickness at the side surface than at the top surface. Therefore, electric charges are injected or emitted through the relatively thin thermal oxide layer at the top surface of the semiconductor fin. In the meantime, due to the relatively thick thermal oxide layer at the side surface, a coupling ratio by a control gate is increased, thereby improving an efficiency of a programming or an erase operation.

In the meantime, in a case of read operation for reading out information stored in the storage electrode, channels are formed at both of the side surface and the top surface of the semiconductor fin. Accordingly, efficiency of the read operation speed is improved.

For example, if a thickness of a thermal oxide layer growing at the top surface of {110} plane is about 70 Å, a thickness of a thermal oxide layer growing at side surfaces of {110} plane is about 85 through 90 □. Accordingly, a coupling ratio of this case is increased about 7 through 10% in comparison with the case when a thermal oxide layer grows with about 70 Å on the entire surface.

It is preferable that the storage electrode as a conductive substance is formed of silicon in the flash memory device. In other words, the storage electrode is a floating gate electrode. In this case, the flash memory device is a floating gate type flash memory device.

In addition, the storage electrode may be a charge-trapping nitride layer. In this case, the flash memory device is a floating trap type flash memory device, or Silicon-Oxide-Nitride-Oxide-Silicon SONOS.

In a case of a floating trap-type flash memory device, it is preferable that an insulating layer formed on the side surface is thinner than an insulating layer formed on the top surface of the semiconductor fin. For example, the side surface of the semiconductor fin represents a crystal plane {100}, and the top surface of the semiconductor fin represents a crystal plane {110}. Accordingly, charges are injected or emitted through a thin insulating layer on both side surfaces of the semiconductor fin, thereby performing a programming or an erase operation. In this case, as a thick insulating layer increasing a coupling ratio is formed on a top surface of a semiconductor fin, an efficiency of a programming or an erase operation may be degraded in comparison with a case of when the thick insulating layer is formed on a side surface of the semiconductor fin. As charges are injected or emitted through an insulating layer on both side surfaces of the semiconductor fin, a decrease of an efficiency of a programming or an erase operation may be compensated.

An embodiment of the present invention provides a method for forming a flash memory device. The method comprises: forming a semiconductor fin including a top surface and a side surface originated from plane different in crystallographical point of view; forming a first insulating layer and a second insulating layer on the side surface and the top surface, respectively; forming a storage electrode on the first insulating layer and the second insulating layer; forming a gate insulting layer on the storage electrode; and forming a control gate electrode on the gate insulating layer.

In one embodiment, the forming the semiconductor fin comprises: preparing a semiconductor substrate having a surface of a crystal plane {100}; and etching the semiconductor substrate so that the side surface becomes a crystal plane {110}. At this time, it is preferable that the first insulating layer and the second insulating layer are thermal oxide layers, respectively. Accordingly, the first insulating layer on a side surface of the semiconductor fin is formed to be thicker than the second insulating layer on the top surface of the semiconductor fin.

In the method, the first insluting layer and the second insulating layer are formed to have different thicknesses so that charges are injected or emitted not through a relatively thick insulating layer of the first insulating layer and the second insulating layer but through a relatively thin insulating layer at a programming operation or an erase operation of the flash memory device.

An embodiment of the present invention provides a method for forming a flash memory device comprising: etching a semiconductor substrate to form a semiconductor fin composed of a top surface and a side surface of different crystal planes so that thermal oxide layers grow to have different thicknesses; performing a thermal treatment process with respect to the semiconductor substrate to form a first thermal oxide layer on the side surface and a second thermal oxide layer on the top surface; and forming a floating layer, a gate insulating layer and a control gate electrode on the first thermal oxide layer and the second thermal oxide layer.

In the method, the forming the semiconductor fin comprises: preparing a semiconductor substrate having a surface of a crystal plane {100}; and etching the semiconductor substrate so that the side surface becomes a crystal plane {110}. Accordingly, the first thermal oxide layer is formed to be relatively thicker than the second thermal oxide layer. At this time, the thicknesses of the first thermal oxide layer and the second thermal oxide layer are determined so that charges are injected or emitted not through the first thermal oxide layer but through the relatively thin thermal oxide layer.

In order to achieve the above object of the present invention, a method for forming a flash memory device comprises: etching a semiconductor substrate to form a semiconductor fin consisting of a top surface and a side surface of the different crystal planes so that a thermal oxide layer grows to have different thicknesses; performing a thermal treatment process with respect to the semiconductor substrate to form a first thermal oxide layer on the side surface and a second thermal oxide layer thicker than the first oxide layer on the top surface; and forming a charge storage nitride layer, a gate insulating layer and a control gate electrode on the first thermal oxide layer and the second thermal oxide layer, respectively.

BRIEF DESCRIPTION OF THE DRAWINGS

The above and other features and advantages of the present invention will become more apparent to those of ordinary skill in the art by describing in detail preferred embodiments thereof with reference to the attached drawings in which:

FIGS. 10A to 14A are plan views illustrating a part of a semiconductor substrate in major steps according to a process order;

FIGS. 10B to 14B are cross-sectional views taken along a line I-I of FIGS. 10A to 14A;

FIGS. 10C to 14C are cross-sectional views taken along a line II-II of FIGS. 10A to 14A.

DETAILED DESCRIPTION OF PREFERRED EMBODIMENTS

Figure 1:
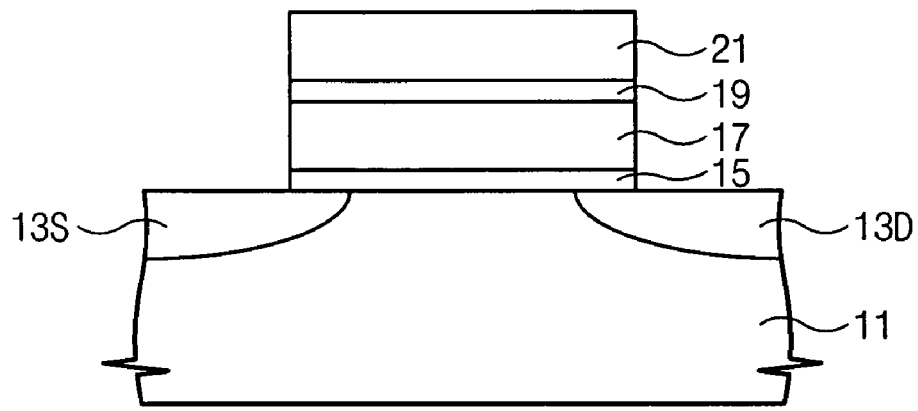
FIG. 1 schematically illustrates a conventional flash memory device.
Figure 2:
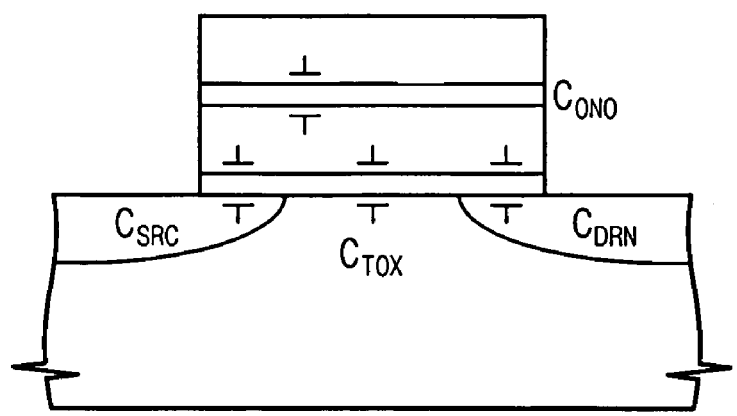
FIG. 2 schematically illustrates a capacitive coupling of a floating gate electrode with respect to various terminals in the conventional flash memory device shown in FIG. 1.

The present invention will now be described more fully hereinafter with reference to the accompanying drawings, in which preferred embodiments of the invention are shown. This invention may, however, be embodied in different forms and should not be constructed as limited to the embodiments set forth herein. Rather, these embodiments are provided so that this disclosure will be thorough and complete, and will fully convey the scope of the invention to those skilled in the art. It will also be understood that when a layer is referred to as being "on" another layer or substrate, it can be directly on the other layer or substrate or intervening layers may also be present. In the drawings, the thickness of layers and regions are exaggerated for clarity.

The present invention relates to a flash memory device using a semiconductor fin where an efficiency of a programming and an erase operation is improved and a method thereof. For this, in the present invention, a top surface and a side surface constituting a semiconductor fin are formed to have different crystal planes so that an insulating layer formed on the crystal plane, preferably, a thermal oxide layer has different thicknesses. Furthermore, according to the present invention, charges are injected or emitted through a thermal oxide layer formed on one of a top surface or a side surface constituting a semiconductor fin, thereby performing a programming operation or an erase operation. A thermal oxide layer, which is not capable of a programming or an erase operation, is formed to be thick to improve an efficiency of a programming or an erase operation.

Figure 3:
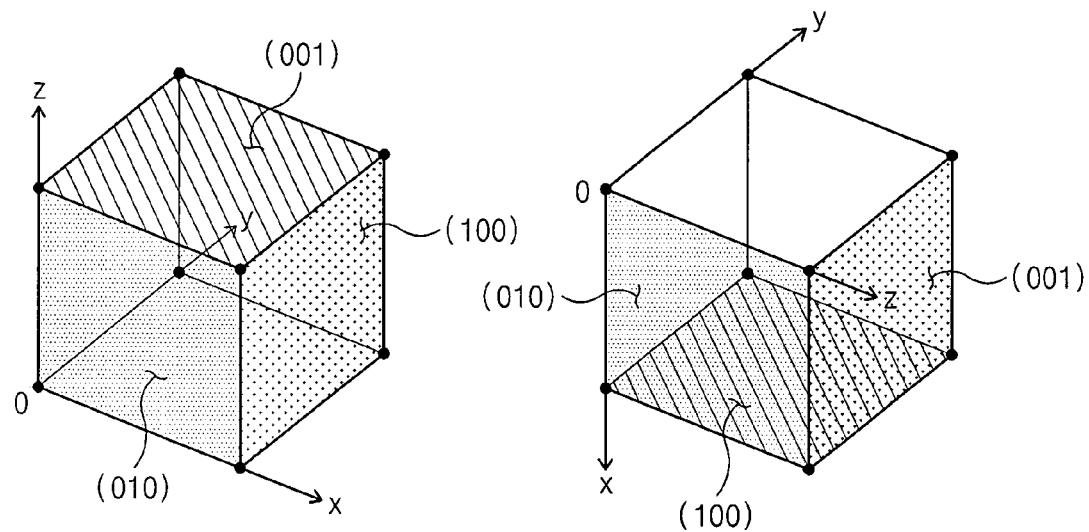
FIG. 3 illustrates equivalent crystal planes of a crystal plane {100} due to a rotation of a lattice.
Figure 4:
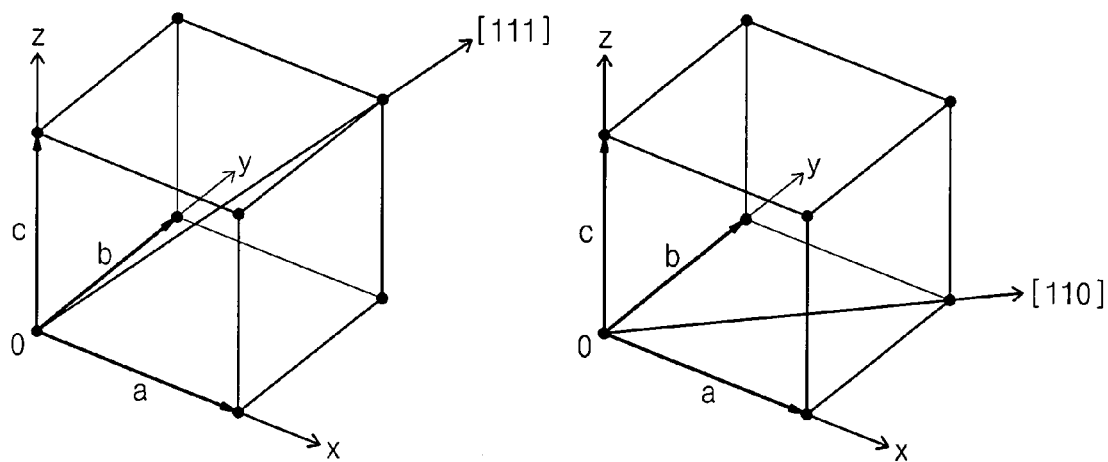
FIG. 4 illustrates a direction of a lattice.

A crystallography will be described briefly for better understanding of the present invention. It is very useful to mention a plane or a direction in a lattice in treating a crystal. In a notation representing a plane or a direction, a set of three integers are used to represent origin of a plane or a direction of a vector in a lattice. The three integers representing a plane in a crystal lattice is determined by a method as follows. First, intersections at which a plane meets three crystal axis are searched for, and represented as a multiple of integers of a basic vector. At this time, the plane may be moved until an intersection with each crystal axis occurs with maintaining its orientation. After reciprocal numbers of these intersections are obtained, a set of three integers h, k and 1 having the minimum integer ratio is made with maintaining the same relation. The set of these three integers h, k and 1 is represented in a parenthesis like (hkl). The set of three integers h, k and 1 is called a Miller index, and defines parallel planes in a lattice. In view of crystallography, a lot of equivalent planes exist in a lattice. In other words, a plane having a specified Miller index may move in a lattice by a method for selecting a location of a unit of area and its orientation. In other words, planes having the same relative symmetry with respect to a crystal lattice axis are called to be equivalent in view of crystallography. These crystallographically equivalent planes are represented in { } instead of ( ). Accordingly, the crystal plane {100} includes three equivalent planes (100), (010) and (001). FIG. 3 illustrates the equivalent crystal planes {100} by a rotation of the lattice. In the meantime, a direction in a lattice is represented as a set of three integers having the same relation as a vector component in the direction. The three vector components are represented as a multiple of a basic vector, transferred into the minimum integer ratio with maintaining their relations and represented using [ ] as brackets. Like a plane, various directions in a lattice are crystallograpically equivalent in a lattice, and represented using < >. For example, a direction <100> includes three crystallographically equivalent directions [100], [010] and [001]. FIG. 4 illustrates a direction of a lattice. It is apparent from FIGS. 3-4 that a direction [hkl] is vertical to a crystal plane (hkl).

Figure 5:
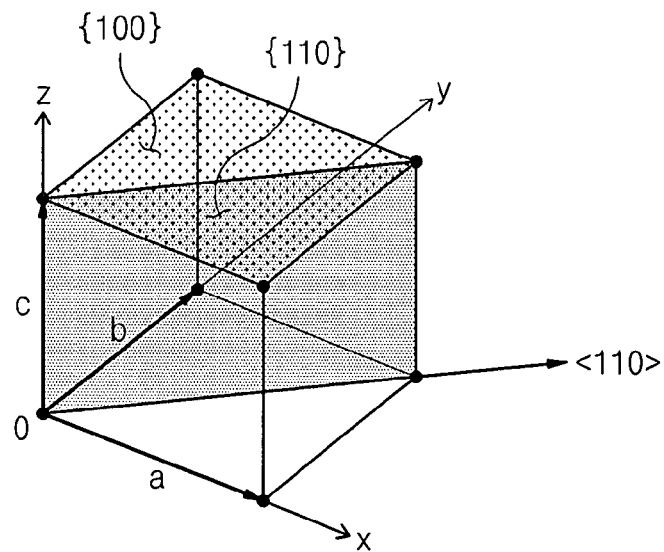
FIG. 5 illustrates crystal planes {100} and {110} which are perpendicular to each other.

Referring to FIG. 5, from the above described overview of the crystallography, it is known that a crystal plane (110) is vertical to a crystal plane (001), and the crystal plane (110) has a direction [110]. In other words, a crystal plane vertical to a crystal plane {100} is {110}, and the crystal plane {110} has a direction <110>. Accordingly, if a substrate at the crystal plane {110} is etched in the direction <110>, the etched cross-section will be a crystal plane {110}. In addition, if the crystal plane {111} is cut along a direction <110>, a crystal plane of the cut section will be {110}.

In an embodiment of the present invention, a semiconductor fin is formed to have different crystal planes. In other words, a crystal plane {100} constitutes a top surface of the semiconductor fin, and a crystal plane {110} constitutes a side surface of the semiconductor fin. If the crystal planes are different from each other, their atomic density will become different. Therefore, a thermal oxide layer having different thicknesses is formed in a thermal oxidation process under the same condition. In other words, according to the present invention, a side surface and a top surface of the semiconductor fin are formed to have different crystal planes so that they have a thermal oxide layer with different thicknesses.

A semiconductor substrate may have various crystal planes according to its manufacturing method. In general, a semiconductor substrate whose surface has a crystal plane {100} is used in a process for manufacturing a semiconductor. As the crystal plane {100} has a charge density 10 times as large as the crystal plane {111}, a semiconductor substrate whose surface crystal plane is {100} is widely used. However, a semiconductor substrate whose surface crystal plane is {110} or {111} can be also used. In any event, if a semiconductor substrate is etched along a proper direction, a semiconductor fin has a top surface and a side surface, which are different in crystallographical point of view.

A semiconductor substrate used in manufacturing a flash memory device according to the present invention may be a substrate formed of a single crystal bulk silicon cut from a single crystal silicon ingot formed with a Czochralski method or a Float Zone growing method, or a substrate including at least one of epitaxial layer selected for providing characteristic improvements and a desired structure, a buried oxide layer or a doping region. Furthermore, a SOI substrate in which a supporting substrate, a buried oxide layer and a semiconductor substrate are sequentially stacked may be used.

Figure 6:
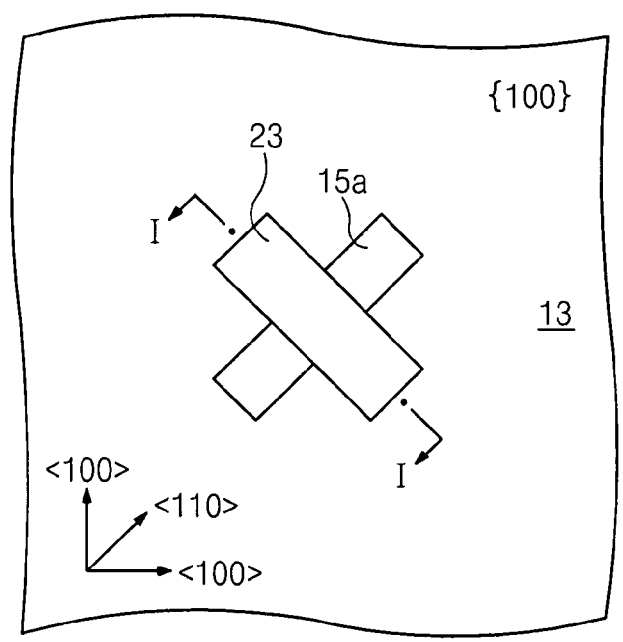
FIG. 6 is a plan view schematically illustrating a flash memory device in accordance with an embodiment of the present invention.
Figure 7:
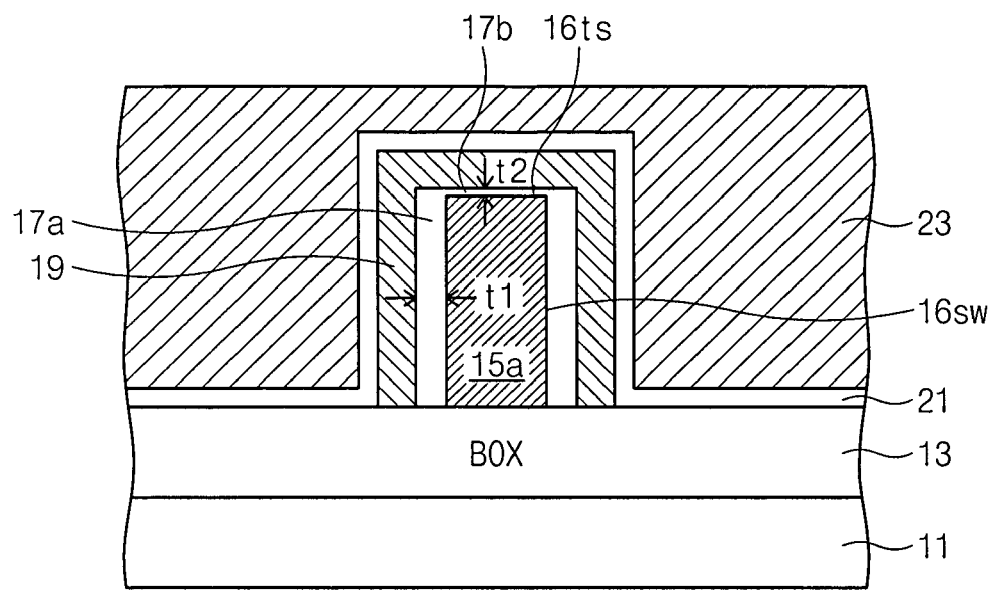
FIG. 7 is a cross-sectional view schematically illustrating a flash memory device taken along a line I-I of FIG. 6.
Figure 8:
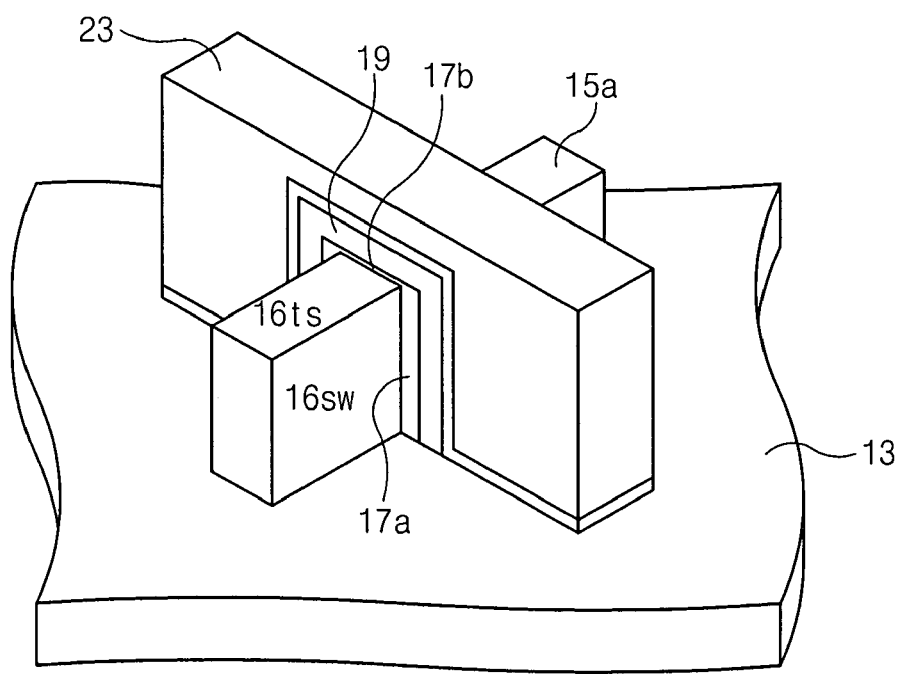
FIG. 8 is a perspective view schematically illustrating a flash memory device according to the present invention.

A floating gate type flash memory device using a SOI substrate now will be described in embodiments. FIG. 6 is a plan view schematically illustrating a flash memory device in accordance with an embodiment of the present invention, FIG. 7 is a cross-sectional view schematically illustrating a flash memory device taken along a line I-I of FIG. 6 and FIG. 8 is a perspective view schematically illustrating a flash memory device according to the present invention. Referring to FIG. 6, a top surface of the semiconductor fin 15*a* is a crystal plane {100}, and the semiconductor fin is extended in a direction <110>. Accordingly, side surfaces of the semiconductor fin 15*a* represent a crystal plane {110}. In addition, a control gate electrode 23*a* runs across the semiconductor fin 15*a*.

More concretely, referring to FIGS. 7 and 8, a flash memory device according to a preferred embodiment of the present invention now will be described. Referring to FIGS. 7 and 8, a floating gate type flash memory device in accordance with a preferred embodiment of the present invention includes a semiconductor fin 15*a* consisting of side surfaces 16*sw* and a top surface 16*ts*. Each of the side surfaces 16*sw* of the semiconductor fin 15*a* have a crystal plane {110}, and a top surface 16*ts* of the semiconductor fin 15*a* has a crystal plane {100}. A first insulating layer 17*a* is formed on the side surfaces 16*sw*, and a second insulating layer 17*b* is located on the top surface 16*ts*. A floating gate electrode 19 is formed on the first insulating layer 17*a* and the second insulating layer 17*b*. A gate insulating layer 21 and a control gate electrode 23*a* are sequentially stacked on the floating gate electrode 19.

It is preferable that the first insulating layer 17*a* and the second insulating layer 17*b* are formed of a thermal oxide layer. A buried oxide layer 13 and a supporting substrate 11 are located below the semiconductor fin 15*a*.

As a top surface 16*ts* and side surfaces 16*sw* of the semiconductor fin 15*a* are originated from different faces, thicknesses of a thermal oxide layer formed on the crystal plane are different from each other. As the crystal plane of the top surface 16*ts* is {100}, its silicon atom density is less than a side surface of a crystal plane {110}. Accordingly, a relatively thin thermal oxide layer or a second thermal oxide layer grows on the top surface 16*ts* than the side surface 16*sw* under the same condition of a thermal oxidation process. In other words, a thickness t1 of the first thermal oxide layer 17*a* on the side surface 16*sw* is thicker than a thickness t2 of the second thermal oxide layer 17*b*. For example, $1.3*t2 \leq t1 \leq 1.4*t2$. Here, a thickness t2 of the second thermal oxide layer 17*b* is so thin that charges are allowed to be penetrated through at a programming or an erase operation. In other words, charges are injected or emitted through a second insulating layer 17*b* on a top surface 16*ts* of a semiconductor fin 15*a* at a programming or an erase operation. On the other hand, a thickness t1 of the first thermal oxide layer 17*a* is so thick that charges are not allowed to be penetrated through at a programming or an erase operation.

Accordingly, according to a floating gate type flash memory device of the present invention, as $C_{TOX}$ in the formula 3 is decreased due to a thick first thermal oxide layer 17a on both side surfaces 16sw of the semiconductor fin 15a, $V_{FG}$ is increased. Therefore, an efficiency of a programming or an erase operation is improved. In other words, a second thermal oxide layer 17b functions as a tunneling insulating layer, and a first thermal oxide layer 17a has a function to increase a coupling ratio.

As a floating gate electrode 19 of a floating gate type flash memory device uses a conductive substance, and charges injected into the electrode are uniformly diffused, all the faces of the semiconductor fin 15a are not required to operate as a tunneling insulating layer. Like in the present invention, a second thermal oxide layer 17b on the top surface 16ts of the semiconductor fin 15a may be operated as a tunneling insulating layer.

A floating gate electrode 19 formed on the adjacent semiconductor fin is electrically isolated from each other. In the meantime, a gate insulating layer 21 has a structure ONO where an oxide layer, a nitride layer and an oxide layer are sequentially stacked.

Figure 9:
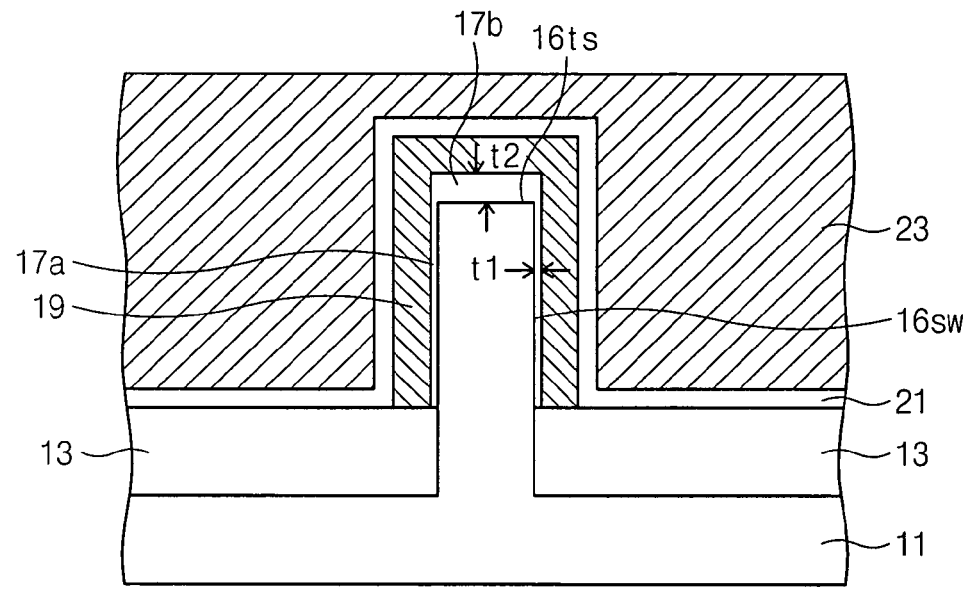
FIG. 9 is a cross-sectional view schematically illustrating a flash memory device in accordance with an embodiment of the present invention.

In the above first embodiment, charges may be injected or emitted through both side surfaces 16sw of the semiconductor fin 15a and a floating gate electrode 19. This will be described with reference to FIG. 9. Unlike the first embodiment, a flash memory device formed on a bulk silicon substrate 11 will be described in a present embodiment. Accordingly, unlike the first embodiment using a SOI substrate, a semiconductor fin 15a is electrically connected with the silicon substrate 11, and the adjacent semiconductor fins are electrically isolated each other by the device isolation layer 13.

In the present embodiment, a first thermal oxide layer 17a is formed to be thin t1 so that charges are injected or emitted through a first thermal oxide layer 17a on both side surfaces 16sw of the semiconductor fin 15a, and a second thermal oxide layer 17b is formed to be thick so that charges are not injected or emitted through a second thermal oxide layer 17b on the top surface 16ts of the semiconductor fin 15a. For example, $1.3*t1 \leq t2 \leq 1.4*t1$. In a method for achieving this, a semiconductor fin 15a is formed so that side surfaces 16sw have a crystal plane {100}, and a top surface 16ts has a crystal plane {110}. In another method, a thermal oxide layer may be formed to be thick only on the top surface by performing additional processes.

A floating gate type flash memory device in accordance with the second embodiment has a small coupling ratio in comparison with the afore-described first embodiment, because a thick thermal oxide layer is formed on both side surfaces of a semiconductor fin in the first embodiment, but a thick thermal oxide layer is formed on a top surface of a semiconductor fin in the present embodiment. However, as charges are injected or emitted through a first insulating layer on both side surfaces of the semiconductor fin, a decrease of a coupling ratio is compensated.

The first embodiment and the second embodiment can be applied to a floating trap type flash memory device. In this case, it is possible to replace a conductive floating gate with a silicon nitride layer of an insulating layer in the first embodiment and the second embodiment. A silicon nitride layer functions as a charge storage electrode. Contrary to a floating gate type flash memory device, the floating trap type memory device has an insulating charge storage electrode, and a charge storage electrode between the adjacent semiconductor fins can be connected each other.

A method for forming a floating gate type flash memory device according to a preferred embodiment of the present invention will be described with reference to FIGS. 10A to 14A, 10B to 14B and 10C to 14C. FIGS. 10A to 14A are plan views illustrating a part of a semiconductor substrate in major steps in accordance with a process order, FIGS. 10B to 14B are cross-sectional views taken along a line I-I in FIGS. 10A to 14A, and FIGS. 10C to 14C are cross-sectional views taken along a line II-II in FIGS. 10A to 14A.

Figure 10A:
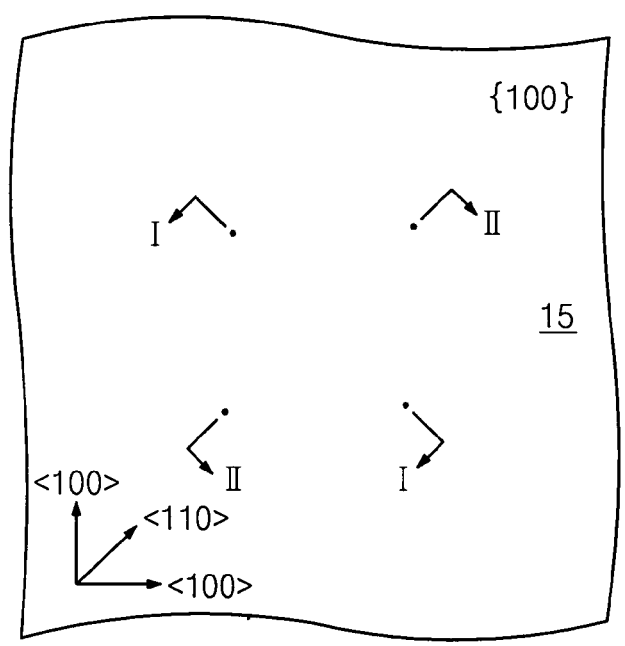
Figure 10B:
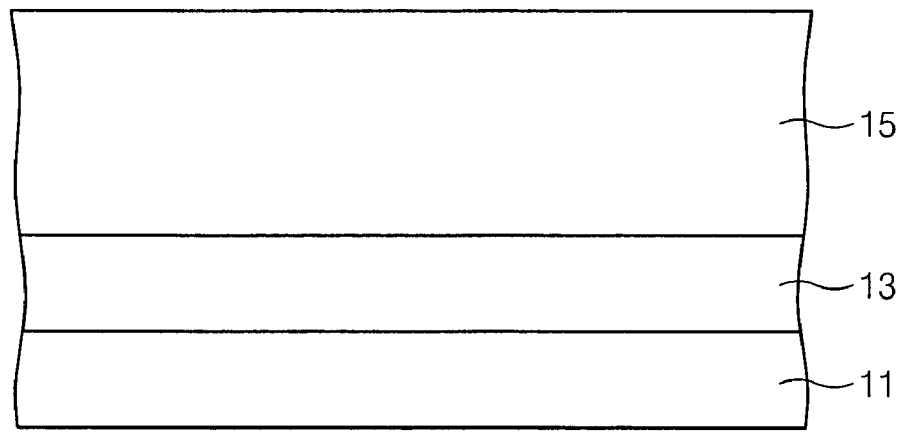
Figure 10C:
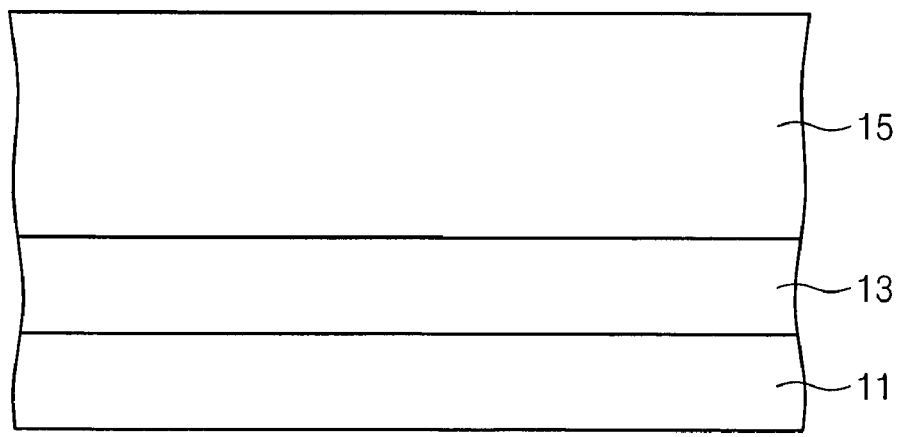

First, with reference to FIGS. 10A to 10C, a supporting substrate 11, a buried oxide layer 13 and a semiconductor substrate 13 are sequentially stacked to form a SOI substrate. The SOI substrate is manufactured by a well-known method. A crystal plane of a top surface 16ts of a semiconductor substrate 15 on the buried oxide layer 13 is {100} plane. The semiconductor substrate 15 is a single crystal bulk silicon substrate cut from a single crystal silicon ingot formed by a Czochralski method or a Floating Zone growing method.

The crystal plane of the top surface 16ts of the semiconductor substrate may represent crystal planes {100} and {111} in accordance with a growing direction of a single crystal silicon ingot. In addition, the top surface 16ts of the semiconductor substrate 15 can represent various crystal planes in accordance with a cutting direction of a single crystal silicon ingot.

Figure 11A:
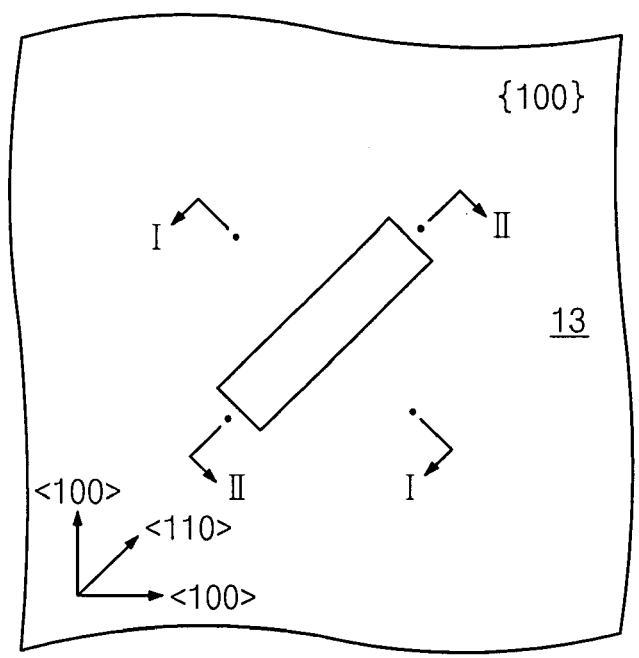
Figure 11B:
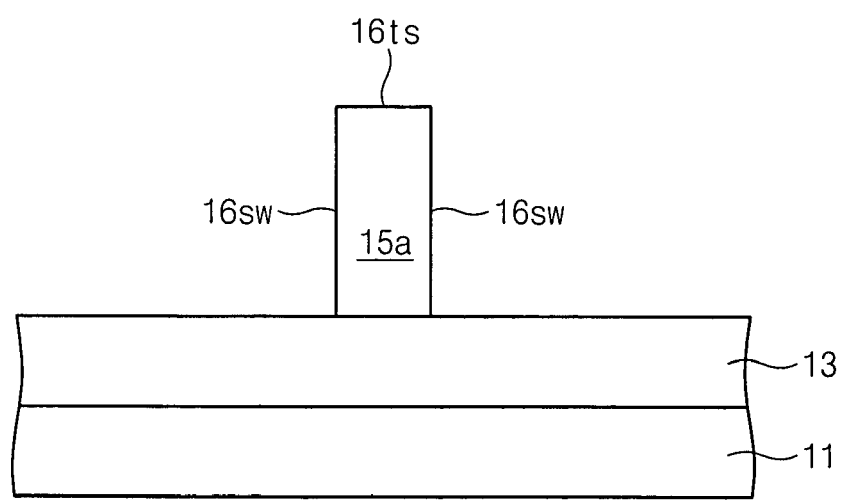
Figure 11C:
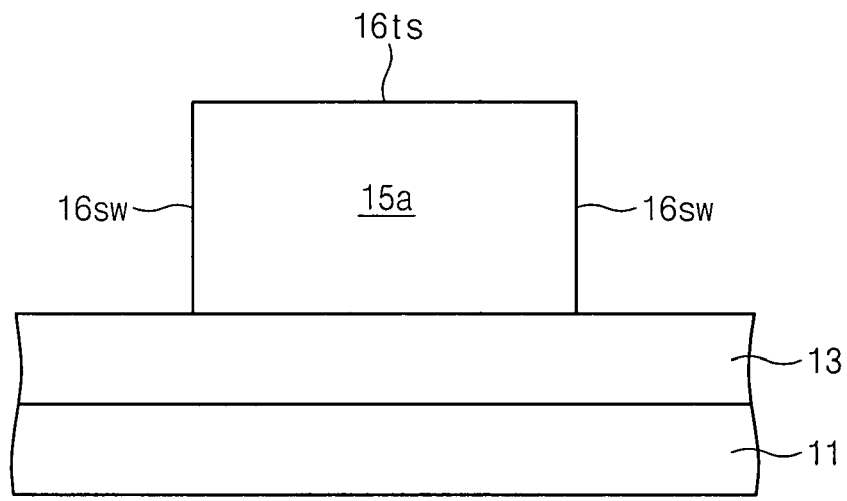

Referring to FIGS. 11A to 11C, the semiconductor substrate 15 is patterned by a well-known method to form a semiconductor substrate 15a consisting of a top surface 16ts and side surfaces 16sw. More concretely, an etch mask is formed on the semiconductor substrate 15 by using a photolithography process, and etching is performed to remove a portion which is not covered with an etch mask, thereby forming a semiconductor fin 15a and removing the etch mask. Here, the semiconductor substrate 15 is etched so that the side surfaces 16sw of the semiconductor fin 15a have crystal planes different from the top surface 16ts of the semiconductor fin 15a. For this, a semiconductor substrate 15 whose crystal plane is {100} can be etched along a direction <110> to form the side surfaces 16sw of the semiconductor fin 15a whose crystal plane is {110}. In other way, a semiconductor substrate 15 can be etched in a direction vertical to the direction <110> to form a semiconductor fin whose side surfaces having {110} plane, which is different from the crystal plane {100} of the top surface.

For example, if a surface of a semiconductor substrate whose crystal plane is (100) is etched along a direction [110], a crystal plane of its side surface becomes a crystal plane (011), which is crystallographically equivalent to the crystal plane (110).

Like this, a semiconductor substrate whose crystal plane {110} of a top surface is etched along a direction <100> to form a crystal plane {100} of the side surfaces of the semiconductor fin.

Figure 12A:
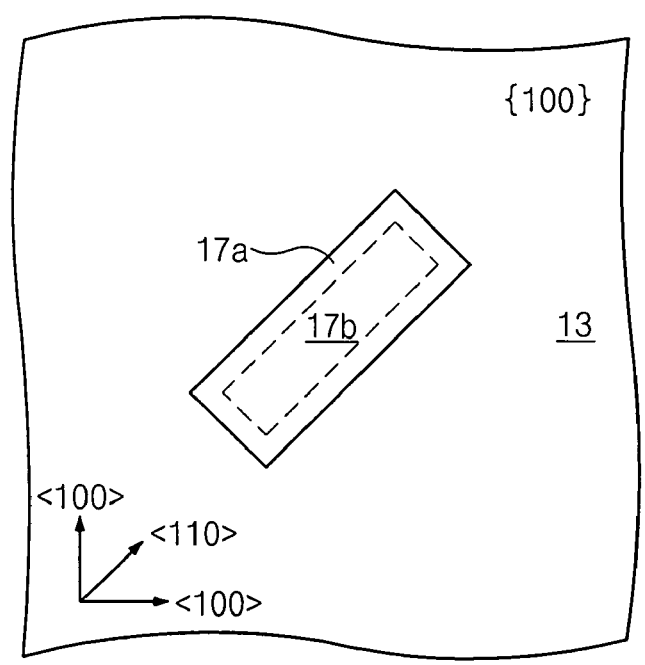
Figure 12B:
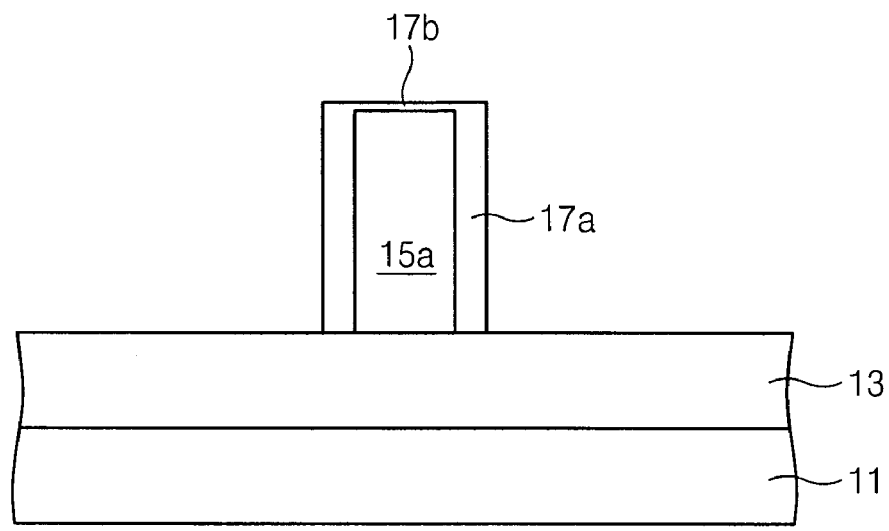
Figure 12C:
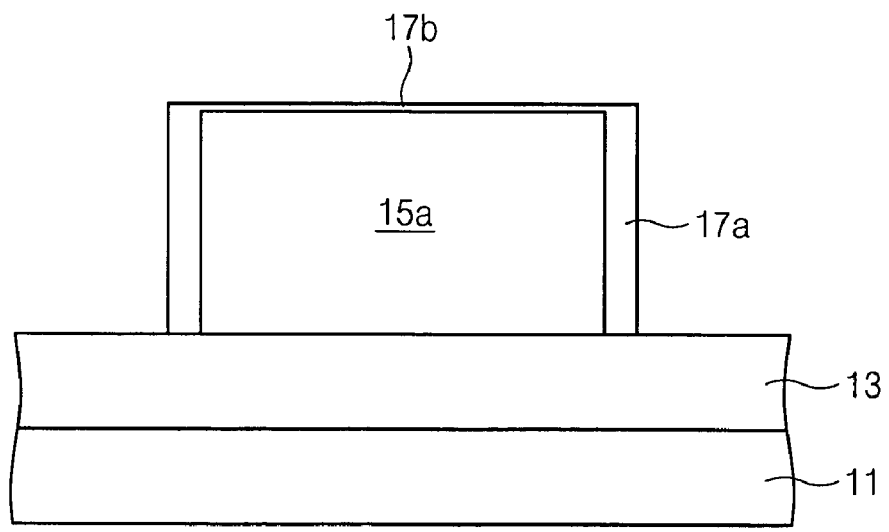

Next, with reference to FIGS. 12A to 12C, a first thermal oxide layer 17a and a second thermal oxide layer 17b are formed on side surfaces 16sw and a top surface 16ts of a semiconductor fin 15a by performing a thermal oxidation process. Here, the side surfaces 16sw and the top surface 16ts have different crystal planes to represent different silicon atom density. Therefore, a growing thermal oxide layer has a different thickness. As the side surfaces 16sw is {110} plane, and the top surface 16ts is {100} plane, the first thermal oxide layer 17a on the side surfaces 16sw is formed to be thicker than the second thermal oxide layer 17b formed on the top surface 16ts. Here, a thermal oxidation process is controlled so that the first thermal oxide layer and the second thermal oxide layer have thicknesses for charges to be injected or emitted through the second thermal oxide layer, but charges not to be injected or emitted through the first thermal oxide layer.

Figure 13A:
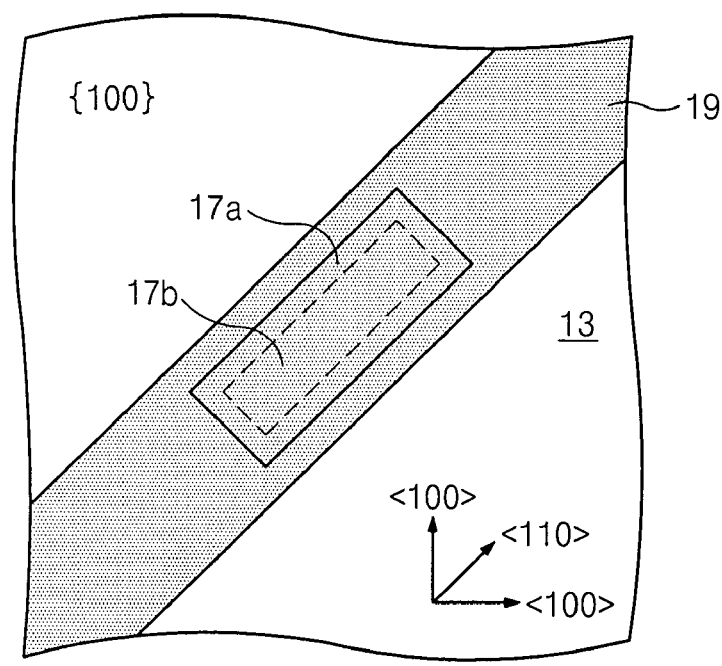
Figure 13B:
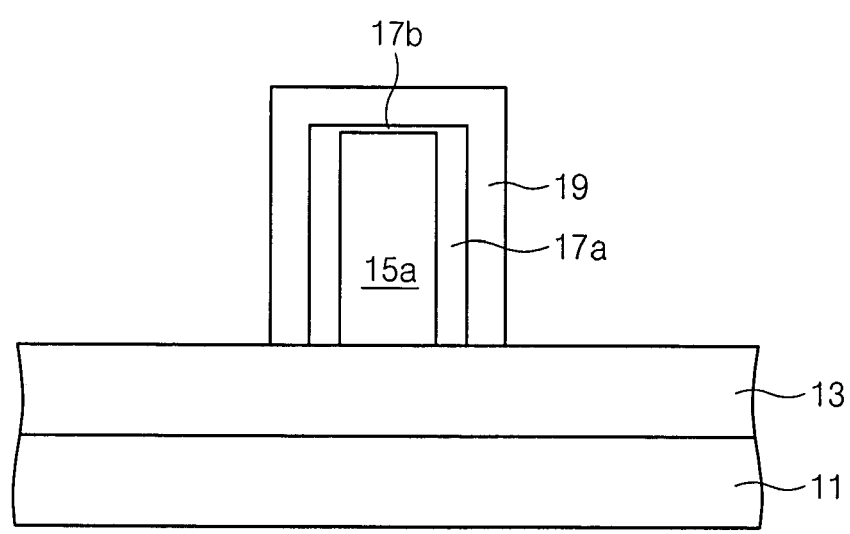
Figure 13C:
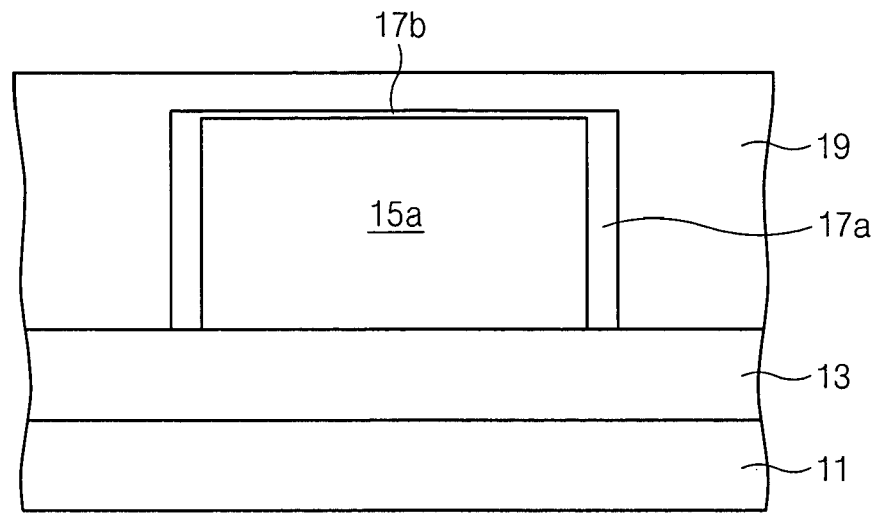

Next, with reference to FIGS. 13A to 13C, a floating gate pattern 19 is formed on the first thermal oxide layer 17a, and the second thermal oxide layer 17b along a semiconductor fin 15a. The floating gate pattern 19 is formed to overlap with the semiconductor fin 15a.

Figure 14A:
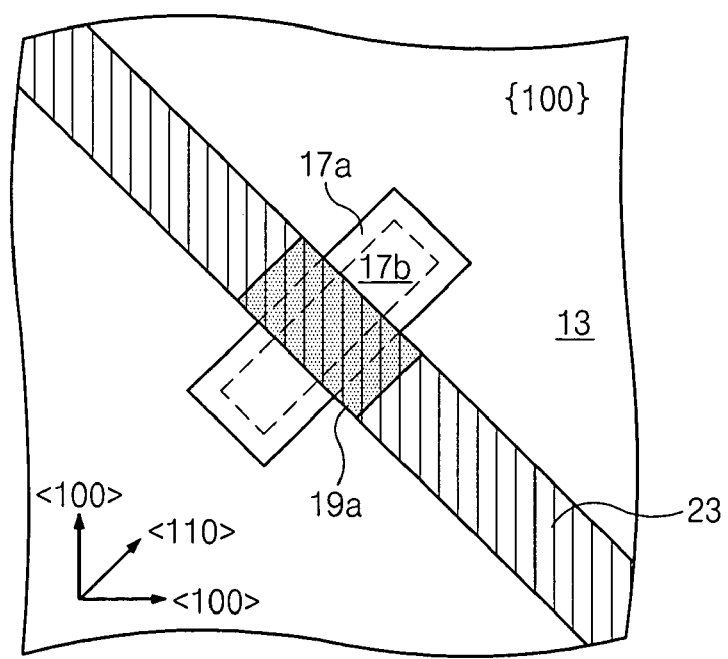
Figure 14B:
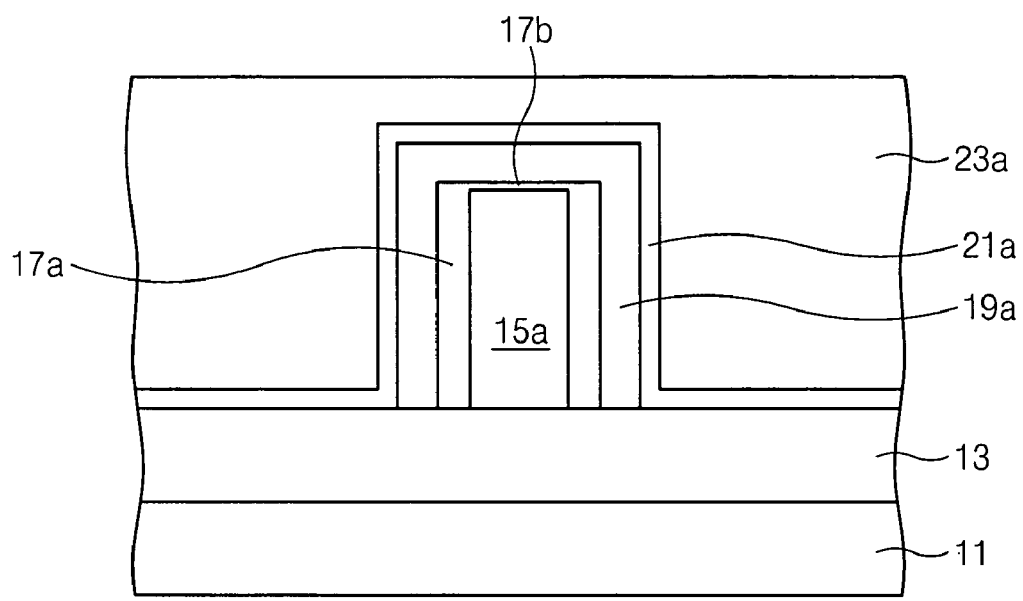
Figure 14C:
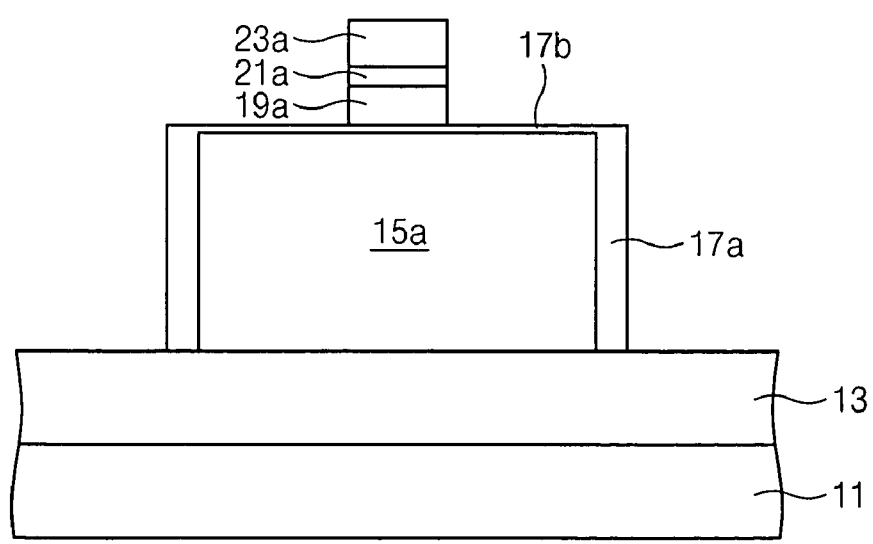

Next, with reference to FIGS. 14A to 14C, a gate insulating layer and a control gate electrode layer are formed, and a control gate electrode layer, a gate insulating layer and a floating gate pattern 19 are patterned to form a control gate electrode 23a, and a gate insulating layer 21A and a floating gate electrode 19A electrically isolated between the adjacent semiconductor fin 15a. The control gate electrode 23a runs cross the semiconductor fin 15a.

For example, the floating gate electrode 19A and the control gate electrode 23a may be formed of silicon. An oxide layer, a nitride layer and an oxide layer are sequentially stacked to form a gate insulating layer.

In the above-described third embodiment, if the floating gate electrode pattern 19 is replaced with a nitride layer, a floating trap type flash memory device is formed. At this time, the nitride layer may be formed on an entire surface of a semiconductor substrate or formed to a line type similar to the floating gate electrode pattern 19 in a process described with reference to FIGS. 13A to 13C. Preferably, the nitride layer is formed on an entire surface of the semiconductor substrate, because the nitride layer is an insulating layer and thus there is no need to pattern the nitride layer.

In the above-described third embodiment, a crystal plane of a top surface of a semiconductor fin 15a is {100}, and a crystal plane of side surfaces of the semiconductor fin 15a is {110}. However, it is possible to form a crystal plane of a top surface to be {110}, and a crystal plane of side surfaces to be {100}. In this case, a semiconductor substrate is manufactured so that a top surface is {110} plane, and side surfaces of a semiconductor fin formed by etching the semiconductor fin in a direction <100> is {100} plane. Accordingly, a thickness of the second thermal oxide layer formed on a top surface of a semiconductor fin may be greater than a thickness of the first thermal oxide layer formed on the side surfaces of a semiconductor fin. Therefore, charges are injected or emitted through the second insulating layer formed on both side surfaces of the semiconductor fin.

Figure 15:
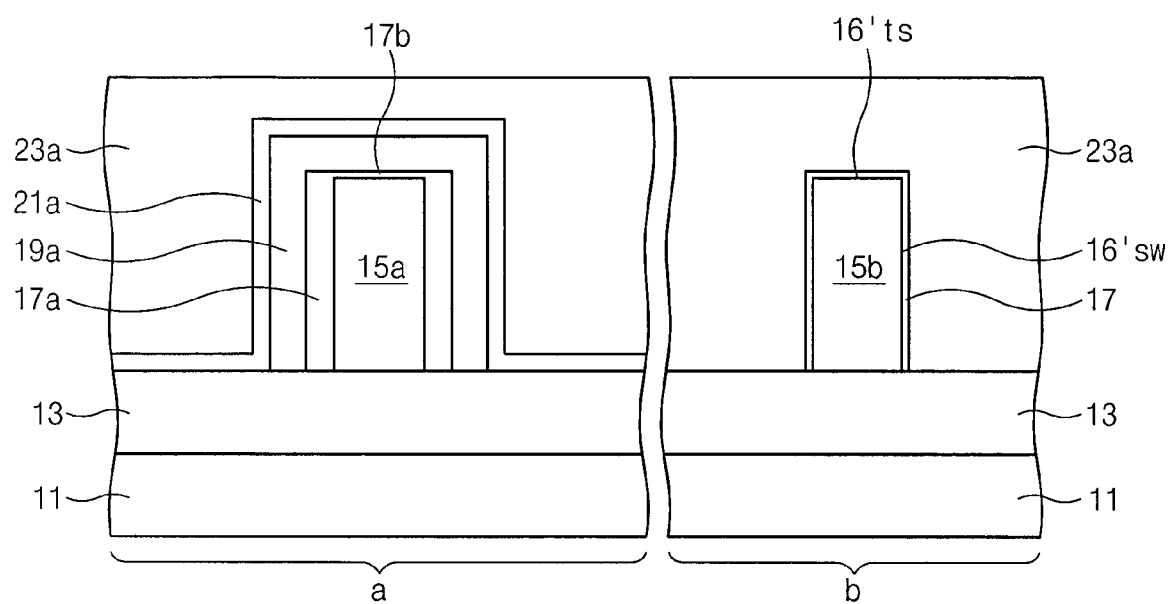
FIG. 15 is a cross-sectional view schematically illustrating a semiconductor substrate in accordance with another embodiment of the present invention.

The present invention may be applicable to a technology for simultaneously forming a flash memory device and a transistor as shown in FIG. 15. In FIG. 15, a reference sign "a" refers to a region for forming a memory device, and a reference sign "b" refers to a region for forming a transistor. The region "a" may be a cell array region, and the region "b" may be a peripheral circuit region. In addition, a flash memory device and a transistor may be formed at the same region.

A flash memory device has been described, and further descriptions of the flash memory device will be omitted. A transistor includes a semiconductor fin 15b, a gate insulating layer 17 formed on a top surface 16'ts and side surfaces 16'sw of a semiconductor fin 15b and a gate electrode 23a formed on a gate insulating layer 17. Here, the top surface 16'ts and the side surfaces 16'sw of the semiconductor fin 15b constituting a transistor may represent the same or a different crystal plane. For example, if a semiconductor substrate having a top surface of a crystal plane {100} is etched along a direction <100>, a cross-section of the semiconductor substrate has a crystal plane {100}. In the meantime, if a semiconductor substrate having a top surface of a crystal plane {100} is etched along a direction <110>, a cross-section of the semiconductor substrate has a crystal plane {110}. Accordingly, in order to improve an operational speed of a transistor, a top surface and side surfaces of a semiconductor fin 15b may be formed appropriately to have a crystal plane for providing a carrier with a high movement.

For example, in a semiconductor fin 15a constituting a flash memory device, a top surface 16ts represents a crystal plane {100}, and a side surface 16sw represents a crystal plane {110}, and in a semiconductor fin 15b constituting a transistor, a top surface 16'ts represents a crystal plane {100}, and a side surface 16'sw represents a crystal plane {110} or {100}. In other words, a top surface 16ts of the semiconductor fin 15a represents the same crystal plane as a top surface 16'ts of the semiconductor fin 15b, and a side surface 16sw of the semiconductor fin 15a represents the same as or a different crystal plane from a side surface 16'sw of the semiconductor fin 15b. A crystal plane of a semiconductor fin may be modified appropriately according to characteristics of each flash memory device or a transistor.

Like in a flash memory device, if a semiconductor fin 15b of a transistor has a top surface 16'ts and a side surface 16'sw of different crystal planes, a gate insulating layer 17 may be formed to have different thicknesses at the top surface 16'ts and the side surface 16'sw.

A gate electrode 23a of the transistor may be formed when a floating gate electrode or a control gate electrode of a flash memory device at a cell region is formed.

While the present invention has been described in connection with specific and preferred embodiments thereof, it is capable of various changes and modifications without departing from the spirit and scope of the present invention. A configuration and operation of a circuit according to the present invention has been described, but it is apparent that the present invention can be changed and modified within the technical spirit and the scope of the present invention.

It should be appreciated that the scope of the invention is not limited to the detailed description of the invention hereinabove, which is intended merely to be illustrative, but rather comprehends the subject matter defined by the following claims.

According to the present invention in the above description, a semiconductor fin having various crystal planes is formed to form an insulating layer with different thicknesses on itself. Accordingly, an insulating layer for injecting or emitting charges is formed to be thin, and an insulating layer for not injecting or emitting charges is formed to be thick, thereby improving an efficiency of a programming or an erase operation of a flash memory device.

In addition, since a semiconductor fin having various crystal planes is employed, thermal oxide layers with different thicknesses may be formed with only a thermal oxidation process except additional processes.

In the meantime, it is possible to improve an operational speed since channels are formed both a top surface and side surfaces of the semiconductor fin at a read operation for reading out the stored information.

What is claimed is:
1. A flash memory device comprising:
    a semiconductor fin including a top surface and a side surface originated from different crystal planes;
    a first insulating layer formed on the side surface and a second insulating layer formed on the top surface;
    a storage layer formed on the first insulating layer and the second insulating layer;
    a gate insulating layer formed on the storage layer; and
    a control gate electrode formed on the gate insulating layer.

2. The device of claim 1, wherein the storage layer is a floating gate electrode, and the gate insulating layer has a stacked structure in which an oxide layer, a nitride layer and an oxide layer are sequentially stacked.

3. The device of claim 1, wherein the storage layer is a nitride layer, and the gate insulating layer is an oxide layer.

4. The device of claim 1, wherein the first insulating layer and the second insulating layer have thicknesses so that charges are injected or emitted not through a relatively thick insulating layer of the first insulating layer and the second insulating layer but through a relatively thin insulating layer of the first and second insulating layer at a programming or an erase operation of the flash memory device.

5. The device of claim 4, wherein the first insulating layer and the second insulating layer have thicknesses so that charges are injected or emitted not through the first insulating layer but through the second insulating layer at a programming or an erase operation of the flash memory device.

6. The device of claim 4, wherein a relatively thick insulating layer of the first insulating layer and the second insulating layer is 1.3 through 1.4 times as thick as a relatively thin insulating layer of the first and second insulating layer.

7. The device of claim 1, wherein the top surface is originated from a crystal plane {100}, and the side surface is originated from a crystal plane {110}.

8. The device of claim 7, wherein the first insulating layer is thicker than the second insulating layer.

9. The device of claim 1, wherein the top surface is originated from a crystal plane {110}, and the side surface is originated from a crystal plane {100}.

10. The device of claim 9, wherein the second insulating layer is thicker than the first insulating layer.

11. The device of claim 1, wherein the top surface is originated from a crystal plane (abc), and the side surface is originated from a crystal plane (hkl),
   wherein a, b and c are integers except 0 at the same time, and h, k and l are integers except 0 at the same time and wherein the set of a, b and c and the set of h, k and l have, at maximum, only two integers in common.

12. A flash memory device comprising:
   a semiconductor fin including a top surface and a side surface originated from different crystal planes;
   a first thermal oxide layer and a second thermal oxide layer with different thicknesses formed on the side surface and the top surface;
   a floating gate electrode formed on the first thermal oxide layer and the second thermal oxide layer;
   a gate insulating layer formed on the floating gate electrode; and
   a control gate electrode formed on the gate insulating layer.

13. The device of claim 12, wherein the first thermal oxide layer is thicker than the second thermal oxide layer.

14. The device of claim 13, wherein the top surface is originated from a crystal plane {100}, and the side surface is originated from a crystal plane {110}.

15. The device of claim 14, wherein the first thermal oxide layer and the second thermal oxide layer have thicknesses so that charges are injected or emitted not through the first thermal oxide layer but through the second thermal oxide layer at a programming or an erase operation of the flash memory device.

16. The device of claim 12, wherein the second thermal oxide layer is thicker than the first thermal oxide layer.

17. The device of claim 16, wherein the top surface is originated from a crystal plane {110}, and the side surface is originated from a crystal plane {100}.

18. The device of claim 17, wherein the first thermal oxide layer and the second thermal oxide layer have thicknesses so that charges are injected or emitted not through the second thermal oxide layer but through the first thermal oxide layer at a programming or an erase operation of the flash memory device.

19. The device of claim 12, wherein a thicker one of the first and second thermal oxide layers is 1.3 to 1.4 times as thick as a thinner one of the first and second thermal oxide layers.

20. A semiconductor device comprising:
   a first semiconductor fin including a top surface and a side surface of a different crystal plane;
   a second semiconductor fin including a top surface having the same crystal plane as the top surface of the first semiconductor fin and a side surface having the same or different crystal plane as the side surface of the first semiconductor fin;
   a first thermal oxide layer and a second thermal oxide layer formed on the top surface and the side surface of the first semiconductor fin, respectively;
   a floating gate electrode formed on the first thermal oxide layer and the second thermal oxide layer;
   a first gate insulating layer and a control gate electrode, which are sequentially formed on the floating gate electrode;
   a second gate insulating layer formed on the top surface and the side surface of the second semiconductor fin; and
   a gate electrode formed on the second gate insulating layer.

21. The device of claim 20, wherein a crystal plane of the top surface of the first semiconductor fin is {100}, and a crystal plane of the side surface is {110}, and
   wherein a crystal plane of the top surface of the second semiconductor fin is {100}, and a crystal plane of the side surface is {100}.

22. The device of claim 20, wherein a crystal plane of the top surface of the first semiconductor fin is {110}, and a crystal plane of the side surface is {100}, and
   wherein a crystal plane of the top surface of the second semiconductor fin is {110}, and a crystal plane of the side surface is {100}.

23. The device of claim 20, wherein a thickness of the first thermal oxide layer is thicker than the second thermal oxide layer, and a thickness of the second gate insulating layer is the same as the first thermal oxide layer.

24. The device of claim 20, wherein a thickness of the first thermal oxide layer is thicker than the second thermal oxide layer, and
   wherein a thickness of the second gate insulating layer formed on a top surface of the second semiconductor fin is the same as that of the second thermal oxide layer, and a thickness of the second gate insulating layer formed on the side surface of the second semiconductor fin is the same as that of the first thermal oxide layer.

* * * * *